(12) United States Patent
Habermann

(10) Patent No.: US 8,399,343 B2
(45) Date of Patent: Mar. 19, 2013

(54) METHOD FOR THE SELECTIVE DOPING OF SILICON AND SILICON SUBSTRATE TREATED THEREWITH

(75) Inventor: Dirk Habermann, Kirchzarten (DE)

(73) Assignee: Gebr. Schmid GmbH & Co. (DE)

( * ) Notice: Subject to any disclaimer, the term of this patent is extended or adjusted under 35 U.S.C. 154(b) by 173 days.

(21) Appl. No.: 12/903,804

(22) Filed: Oct. 13, 2010

(65) Prior Publication Data

US 2011/0114168 A1    May 19, 2011

Related U.S. Application Data

(63) Continuation of application No. PCT/EP2009/002671, filed on Apr. 9, 2009.

(30) Foreign Application Priority Data

Apr. 14, 2008 (DE) .......................... 10 2008 019 402

(51) Int. Cl.
H01L 21/316 (2006.01)
(52) U.S. Cl. ......... 438/563; 438/549; 323/906; 320/101
(58) Field of Classification Search ........... 257/E27.124, 257/E27.125, E25.007, E25.009; 438/563, 438/549, 510; 323/906; 320/101
See application file for complete search history.

(56) References Cited

U.S. PATENT DOCUMENTS

| 3,340,445 A | 9/1967 | Scott, Jr. et al. |
| 4,070,689 A | 1/1978 | Coleman et al. |
| 4,152,824 A | 5/1979 | Gonsiorawski |
| 4,206,026 A | 6/1980 | Briska et al. |
| 4,478,879 A | 10/1984 | Baraona et al. |
| 4,758,525 A | 7/1988 | Kida et al. |
| 5,013,396 A | 5/1991 | Wise et al. |
| 5,543,333 A | 8/1996 | Holdermann |
| 6,096,968 A | 8/2000 | Schlosser et al. |
| 6,232,207 B1 | 5/2001 | Schindler |

(Continued)

FOREIGN PATENT DOCUMENTS

| DE | 4217428 A1 | 6/1993 |
| JP | 2000183379 A | 6/2000 |

(Continued)

OTHER PUBLICATIONS

English translation of Office Action issued in corresponding Taiwanese Patent Application No. 098112336.

(Continued)

*Primary Examiner* — Fernando L Toledo
*Assistant Examiner* — Peter Bradford
(74) *Attorney, Agent, or Firm* — Akerman Senterfitt

(57) ABSTRACT

A method for the selective doping of silicon of a silicon substrate (1) for producing a pn-junction in the silicon is characterized by the following steps: a) Providing the surface of the silicon substrate (1) with a doping agent (2) based on phosphorous, b) heating the silicon substrate (1) for creating a phosphorous silicate glass (2) on the surface of the silicon, wherein phosphorous diffuses into the silicon as a first doping (3), c) applying a mask (4) on the phosphorous silicate glass (2), covering the regions (5) that are later highly doped, d) removing the phosphorous silicate glass (2) in the non-masked regions, e) removing the mask (4) from the phosphorous silicate glass (2), f) again heating for the further diffusion of phosphorous from the phosphorous silicate glass (2) into the silicon as a second doping for creating the highly doped regions (5), g); complete removal of the phosphorous silicate glass (2) from the silicon.

9 Claims, 2 Drawing Sheets

U.S. PATENT DOCUMENTS

| | | |
|---|---|---|
| 6,695,903 B1 | 2/2004 | Kubelbeck et al. |
| 7,629,257 B2 | 12/2009 | Klein et al. |
| 7,705,236 B2 | 4/2010 | Ishikawa et al. |
| 2003/0134469 A1* | 7/2003 | Horzel et al. ............ 438/249 |
| 2004/0242019 A1 | 12/2004 | Klein et al. |
| 2007/0151598 A1 | 7/2007 | De Ceuster et al. |
| 2007/0290283 A1 | 12/2007 | Park et al. |
| 2009/0017606 A1 | 1/2009 | Fath et al. |
| 2009/0020156 A1 | 1/2009 | Ohtsuka et al. |
| 2009/0020158 A1 | 1/2009 | Ohtsuka et al. |

FOREIGN PATENT DOCUMENTS

| | | |
|---|---|---|
| JP | 2004281569 A | 10/2004 |
| WO | 97/13280 A1 | 4/1997 |

OTHER PUBLICATIONS

English translation of Search Report issued in corresponding Taiwanese Patent Application No. 098112336.

\* cited by examiner

METHOD FOR THE SELECTIVE DOPING OF SILICON AND SILICON SUBSTRATE TREATED THEREWITH

CROSS-REFERENCE TO RELATED APPLICATIONS

This application is a continuation of PCT Application No. PCT/EP2009/002671, filed 9 Apr. 2009, and claims priority to DE 102008019402.6 filed. 14 Apr. 2008, the disclosures of which are hereby incorporated by reference in their entirety.

FIELDS OF APPLICATION AND PRIOR ART

The invention relates to a method for the selective doping of silicon of a silicon substrate in order to produce a pn junction in the silicon. This method is required for example in the production of solar cells.

The selective doping of the emitter of silicon for the production of a pn junction in silicon is used to improve the contact-making and conduction properties in solar technology. The efficiency of solar cells can be increased by means of this process. Laser technologies wherein the doping medium diffuses into the silicon by means of a high-energy laser beam have previously been used for the production of selective emitters. Other methods are based on the plasma etching of highly doped emitters. The regions in which the high doping is intended to be retained are masked beforehand.

One example of further methods is U.S. Pat. No. 5,871,591, wherein in principle the regions in which the initially high doping is intended to be retained after etching are usually masked lithographically. These methods therefore remove a thin layer, usually 100-200 nm thick, having a high doping near the surface, in order to obtain a selective emitter distribution. One disadvantage of these methods, however, is that the etching of the surface has to be effected very precisely in order not to bring about a significant loss in the efficiency of the solar cells. In the case of laser-aided technologies, there is likewise the risk of severe damage to the solar cell surface, which is why this technology is also used only very occasionally in solar technology.

OBJECT AND WAY OF ACHIEVING IT

The invention is based on an object of providing an initially mentioned method as well as a silicon substrate treated therewith whereby problems in the prior art can be eliminated and, in particular, an efficient and readily practicable method for the selective doping of a silicon substrate can be achieved.

This object is achieved by means of a method for the selective doping of silicon of a silicon substrate for the production of a pn junction in said silicon, which includes the following steps:
a) coating a surface of said silicon substrate with a phosphorus-based dopant;
b) subsequently heating said silicon substrate in order to produce a phosphosilicate glass on said said surface of said silicon, wherein said phosphorus simultaneously diffuses into said silicon as a first doping;
c) applying a masking to said phosphosilicate glass in such a way that said masking covers said subsequently highly doped regions, wherein non-masked regions are produced;
d) removing said phosphosilicate glass in said non-masked regions;
e) removing said masking from said phosphosilicate glass;
f) renewed heating for further indiffusion of phosphorus from said phosphosilicate glass into said silicon as a second doping for production of highly doped regions; and
g) completely removing said phosphosilicate glass and said oxide from said silicon substrate.

The object is also achieved by a silicon substrate formed using this method. Advantageous and preferred configurations of the invention are specified in the claims and are explained in more detail below. In this case, some of the features are mentioned only for the method or the silicon substrate, but are intended to be applicable independently thereof to all aspects of the invention. The wording of the claims is incorporated by express reference in the content of the description. Furthermore, the wording of the priority application DE 102008019402.6 of 14 Apr. 2008 in the name of the present applicant is incorporated by express reference in the content of the present description.

The method has the following steps according to the invention. In a step a), the surface of the silicon or of the silicon substrate is coated with a dopant which is based on phosphorus or contains phosphorus. By way of example, this is a solution composed of phosphoric acid. In a step b) afterwards, the silicon substrate is heated, as is the dopant, in order to produce phosphosilicate glass from the dopant on the surface. In this case, phosphorus is simultaneously diffused into the silicon as first doping of the silicon substrate. The intensity of this doping can be set by the duration and temperature of the heating.

In a subsequent step c), a masking is applied to the phosphosilicate glass on the surface of the silicon substrate. In this case, the masking is applied in such a way that it covers the subsequently highly doped regions of the silicon substrate. In a subsequent step d), the phosphosilicate glass is removed in the non-masked regions. Afterwards in turn, in a step e), the masking is removed from the surface or the phosphosilicate glass. In a subsequent step f), the silicon substrate is heated anew in order to bring about a further indiffusion of phosphorus from the residual phosphosilicate glass into the silicon. This is the second doping of the silicon substrate in order to produce the highly doped regions. In the regions that are free of phosphosilicate glass, only the comparatively low phosphorus doping near the surface serves as a secondary doping source for the deeper diffusion of phosphorus into the base material. In a further step g), the remaining phosphosilicate glass and the oxide on the weakly doped regions are also completely removed from the silicon substrate. This procedure not only generally provides a selective doping of a silicon substrate with highly doped regions that can form emitters of a solar cell. It is primarily also possible to provide a method which provides suitable production or processing of silicon substrates on a large scale. The method can primarily be carried out in a continuous-throughput apparatus. Complicated technology such as lasers or plasma etching sources can be obviated.

In a further configuration of the method according to the invention, the phosphorus-based dopant can be a solution containing phosphoric acid.

A printing technology can be used to apply the masking to the silicon substrate and the phosphosilicate glass formed thereon. This can be effected either by means of screen printing or alternatively by means of so-called inkjet printing technology. In this case, the masking, which comprises a wax or resist, for example, is applied in liquid or pasty form by means of a method corresponding to that used in so-called inkjet printers. A desired masking can thereby be produced both very accurately and rapidly and over a large area. By means of this method, a contact grid can be produced for example as a highly doped or conductive emitter, wherein the solar cell is formed by the silicon substrate. The highly doped regions arise as a result of the double doping of the silicon. The doping can be effected even more intensely primarily in step f) of the second doping by means of a longer duration of action or longer heating. Consequently, the doping can be many times higher in the highly doped region than in the other, more lightly doped regions.

In order to remove the phosphosilicate glass in the non-masked regions in accordance with step c), an etching process can be used. By way of example, HF-based etching solutions are appropriate here, but other etching media are also possible. This can be effected either in one process step or in a plurality of steps with different chemicals.

A continuous-throughput apparatus for carrying out the method can comprise a plurality of modules. In this case, a plurality of the steps can possibly also be carried out in one module. A horizontal continuous-throughput apparatus on which the silicon substrates are conveyed and treated in a horizontal position is particularly preferred.

These and further features emerge not only from the claims but also from the description and the drawings, wherein the individual features can be realized in each case by themselves or as a plurality in the form of subcombinations in an embodiment of the invention and in other fields and can constitute advantageous and inherently protectable embodiments for which protection is claimed here. The subdivision of the application into sub-headings and individual sections does not restrict the general validity of statements made hereunder.

BRIEF DESCRIPTION OF THE DRAWINGS

An exemplary embodiment of the invention is schematically illustrated in the drawings and is explained in more detail below. In the drawings.

DETAILED DESCRIPTION OF THE EXEMPLARY EMBODIMENT

Figure 1:
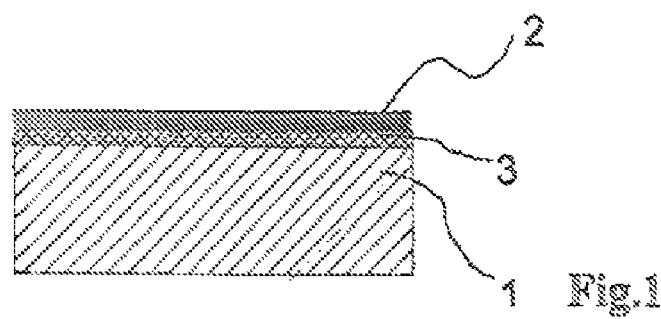
FIGS. 1 to 6 show method steps a) to g) on a silicon substrate for the production of a solar cell.

FIG. 1 illustrates a silicon substrate 1, to which a dopant has been applied over a large area in accordance with step a) and step b). This dopant 2 contains phosphorus or is based on phosphorus and is for example a solution composed of phosphoric acid. Furthermore, phosphorus is indiffused from the dopant 2 into the silicon substrate 1 or the top side thereof by heating in a manner not illustrated in greater detail, for example by radiant heaters or the like. A lightly doped region 3 has arisen as a result, which is illustrated by the cross hatching.

Figure 2:
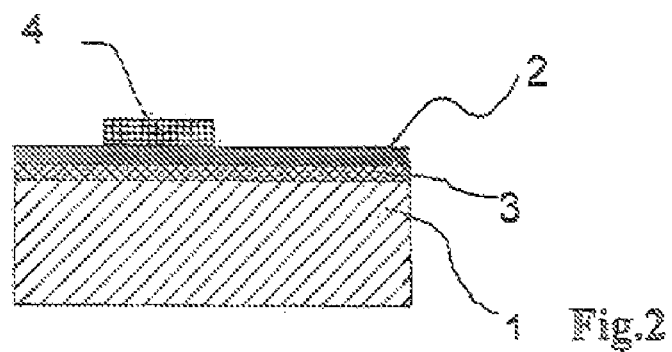

FIG. 2 illustrates how a masking 4 is applied to the top side of the dopant 2 in accordance with step c). This masking 4 is applied by means of an inkjet printing technology in the manner described above and advantageously runs largely in the narrow tracks illustrated, though other masking patterns are also possible. These tracks of the masking 4 correspond to the desired highly doped regions, which will be discussed in even more detail below.

Figure 3:
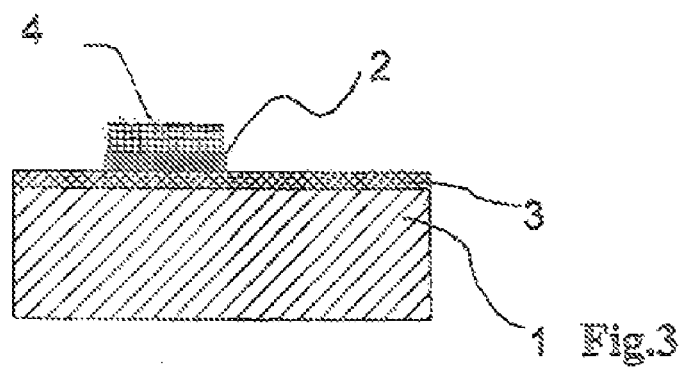

FIG. 3 illustrates how, in accordance with step d), the dopant 2, which has been converted into phosphosilicate glass after the heating in accordance with FIG. 1 and step b), has been removed wherever it is not covered by the masking 4. Consequently, essentially the surface of the lightly doped region 3 of the silicon substrate 1 is uncovered. Correspondingly formed regions of the phosphosilicate glass 2 are still present beneath the masking 4.

Figure 4:
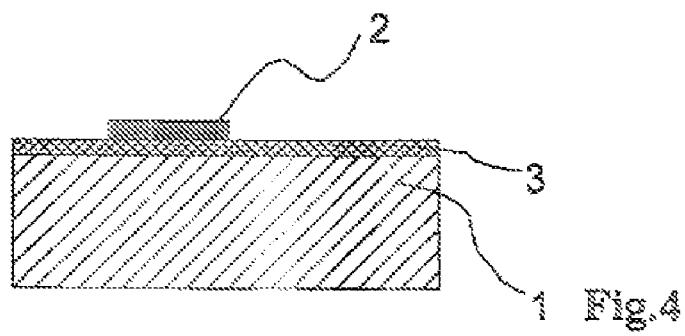

As is illustrated in FIG. 4, the masking 4 is subsequently removed in accordance with step e). While the phosphosilicate glass can be removed by HF etching in step d) in accordance with FIG. 3, a much less aggressive solution suffices for removing the masking 4.

Figure 5:
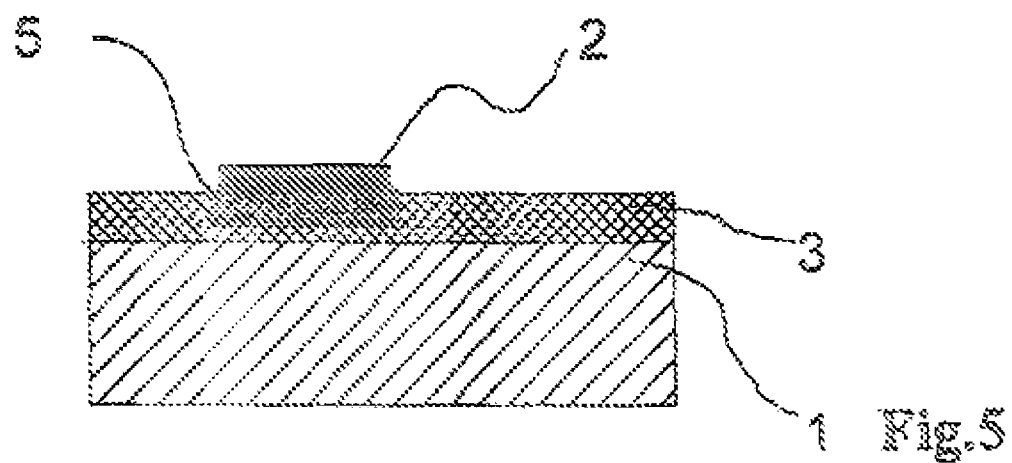

FIG. 5 illustrates how, in accordance with step f), phosphorus indiffuses anew into the silicon substrate 1 by renewed heating from the now uncovered phosphosilicate glass 2 with a form corresponding to the masking 4 that was applied and removed again. The phosphorus from the phosphosilicate glass 2 forms a narrow region with a form corresponding to the phosphosilicate glass 2 in accordance with FIG. 4 or the masking 4 in accordance with FIG. 2. It is also the case moreover that in the lightly doped region 3 of the silicon substrate 1, that is to say essentially over the whole area, phosphorus is diffused from the region near the surface into the silicon substrate 1 somewhat more deeply than is the case after the first diffusion step. In the lightly doped region 3 and in the highly doped region 5, the phosphorus concentration decreases from the surface into the base material, wherein the doping depth can indeed differ.

Figure 6:
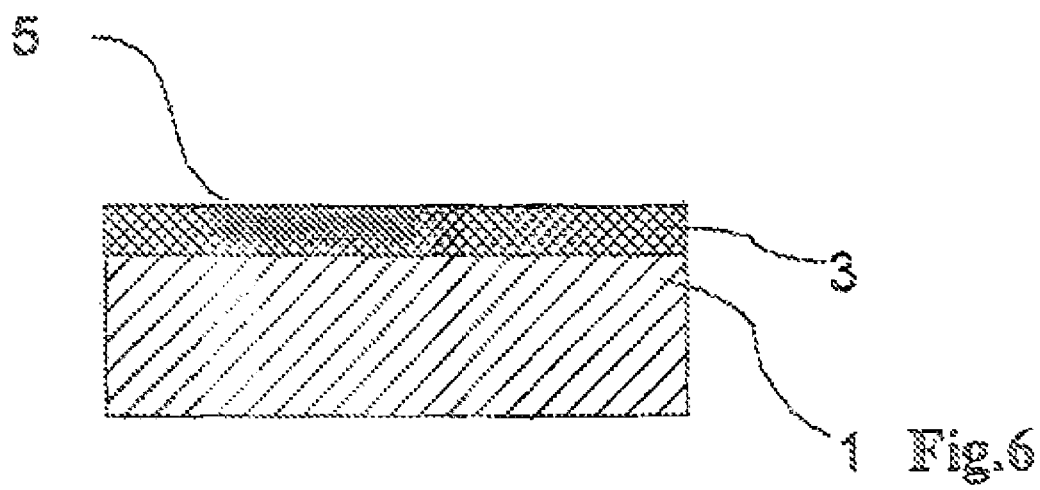

In accordance with step g), as is illustrated in FIG. 6, the remaining phosphosilicate glass 2 is also removed, advantageously again by HF etching. A thin layer with an oxide in the weakly doped region is likewise removed during this step. The silicon substrate 1 in accordance with FIG. 6 is then present with a region 3 lightly doped over the whole area. The highly doped regions 5 run in this lightly doped region 3 and form the low-impedance emitter or a so-called contact grid in a solar cell.

The invention enables a selective doping of a silicon substrate to be effected by means of methods which are readily controllable technologically and which can all be carried out in continuous fashion. It is thus possible by way of example, as described, to produce a contact grid for a solar cell.

The invention claimed is:

1. A method for selectively doping of silicon of a silicon substrate for providing a pn junction in said silicon, comprising the following steps:
   a) coating a surface of said silicon substrate with a phosphorus based dopant;
   b) subsequently heating said silicon substrate in order to produce a phosphosilicate glass on said surface of said silicon substrate, wherein said phosphorus simultaneously diffuses into said silicon as a first doping;
   c) applying a masking to said phosphosilicate glass so as to cover masked regions and to leave non-masked regions uncovered;
   d) removing said phosphosilicate glass in said non masked regions while leaving remaining phosphosilicate glass in said masked regions;
   e) removing said masking from said remaining phosphosilicate glass;
   f) renewed heating for further indiffusion of phosphorus from said remaining phosphosilicate glass into said silicon as a second doping for providing corresponding highly doped regions; and
   g) completely removing said remaining phosphosilicate glass and oxide from said silicon substrate.

2. The method according to claim 1, wherein said phosphorus based dopant is a solution comprising phosphoric acid.

3. The method according to claim 1, wherein said masking is applied by means of a printing technology.

4. The method according to claim 3, wherein said masking is applied by means of an inkjet printing technology.

5. The method according to claim 1, wherein a contact grid of a solar cell is produced thereby, wherein said silicon substrate forms said solar cell, wherein said highly doped regions constitute a contact region of said solar cell.

6. The method according to claim 1, wherein said removal of said phosphosilicate glass in said non masked regions in accordance with step d) is effected by etching.

7. The method according to claim 6, wherein said removal of said phosphosilicate glass in said non masked regions in accordance with step d) is effected by HF etching.

8. The method according to claim 1, wherein said method is carried out in a continuous-throughput apparatus.

9. The method according to claim 8, wherein said method is carried out in a horizontal continuous throughput apparatus.

* * * * *